United States Patent [19]
Schweizer et al.

[11] Patent Number: 5,211,325
[45] Date of Patent: May 18, 1993

[54] METHOD AND APPARATUS FOR SOLDERING SURFACE-MOUNTABLE COMPONENTS TO A PRINTED CIRCUIT BOARD

[75] Inventors: Matthias Schweizer, Igenhausen; Horst Derleth, Diedorf, both of Fed. Rep. of Germany

[73] Assignee: Siemens Nixdorf Informationssysteme AG, Fed. Rep. of Germany

[21] Appl. No.: 896,672

[22] Filed: Jun. 10, 1992

[30] Foreign Application Priority Data

Jun. 26, 1991 [DE] Fed. Rep. of Germany ....... 4121107

[51] Int. Cl.$^5$ ................................................ B23K 3/00
[52] U.S. Cl. ..................... 228/105; 228/6.2; 228/180.2
[58] Field of Search ..................... 228/3.1, 6.2, 180.2, 228/105; 219/85.18

[56] References Cited

U.S. PATENT DOCUMENTS

| | | | |
|---|---|---|---|
| 4,300,715 | 11/1981 | Keizer et al. | 228/180.2 |
| 4,828,162 | 5/1989 | Donner et al. | 228/180.2 X |
| 5,033,665 | 7/1991 | Todd | 228/105 X |
| 5,094,381 | 3/1992 | Amos et al. | 228/6.2 |
| 5,113,581 | 5/1992 | Hidese | 228/180.2 X |

OTHER PUBLICATIONS

*IBM Technical Disclosure Bulletin* vol. 31 No. 5 Oct. 1988 pp. 20–22.

Primary Examiner—Kenneth J. Ramsey
Attorney, Agent, or Firm—Hill, Steadman, & Simpson

[57] ABSTRACT

A method and apparatus for soldering surface-mountable components to a printed circuit board includes a soldering head have a suction pipette located in the center of a thermode with a rectangularly arranged set of soldering stirrups. The thermode and suction pipette are individually vertically moveable relative to one another for precise positioning of a surface-mountable component at a predetermined position on a printed circuit board. Soldering at a predetermined solder location with positional correctness is accomplished in a single work cycle.

2 Claims, 3 Drawing Sheets

METHOD AND APPARATUS FOR SOLDERING SURFACE-MOUNTABLE COMPONENTS TO A PRINTED CIRCUIT BOARD

BACKGROUND OF THE INVENTION

1. Field of the Invention

The present invention is directed generally to a method and apparatus for aligning outer leads of surface-mountable components with solder pads on a printed circuit board during soldering.

2. Description of the Related Art

On surface-mountable components having outer lead spacings of greater than 150 micrometers, it is known to implement outer lead bonding onto mounting locations by two separate systems, first, a component positioning system and, second, a lead soldering system. The positioning system positions the component, or module, in place on a circuit board or other mounting location and, after the module is in place, releases the module system without having fixed the module at the mounting location. The soldering process on the placed module is then begun, which may result in displacement of the module. Displacement results in the outer leads being soldered in incorrect positions, which must thereafter be corrected. The outer leads may even fail to contact the correct solder locations.

Stirrup soldering is generally utilized in mounting surface-mountable components to their mounting locations. It is possible to tack the corner leads in position before undertaking soldering of the rest of the leads using the soldering stirrup. This, however, requires an additional step.

In circuit modules having outer lead spacings of less than 150 micrometers, the stirrup soldering apparatus is usually avoided and single lead soldering is mainly employed, preferable using soldering tips or lasers. However, single lead soldering is extremely time-consuming and extremely difficult to automate. Further, the problem of exactly placing the module in position on the printed circuit board is not overcome by such single lead soldering.

SUMMARY OF THE INVENTION

It is an object of the invention to provide a method and apparatus for soldering surface-mountable components to printed circuit boards by which multi-pole microcomponents, particularly those having outer lead spacings of less than 150 micrometers, may be soldered onto solder pads of printed circuit boards in the correct position and in a single work cycle.

According to the invention, a thermode of a soldering head is lowered into a correct, or predetermined, position over a component in a bending sink with which the outer leads of the component have been bent and cut. The thermode remains over the module, or component, to be soldered until a suction pipette through which a vacuum is applied is lowered onto the surface of the component to thereby draw the component against the pipette. The position of the outer leads of the circuit module relative to the soldering stirrups of the thermode is optically checked and corrected when necessary.

The component is then removed from the bending sink by lifting the suction pipette and the component is moved to a mounting location on a printed circuit board and lowered to such an extent that the outer leads of the component are just above the appertaining solder pads or other mounting locations on the printed circuit board. An optical system is moved into place in the immediate proximity of the solder locations and the accuracy of the positions of the outer leads of the component over the solder pads of the printed circuit board is checked and corrected if necessary. Subsequently, the optical system is removed and the thermode of the soldering head is lowered until the outer leads of the component are pressed against the solder pads of the printed circuit board. Thereafter, the vacuum applied to the suction pipette is discontinued, the pipette is displaced somewhat upwardly, and nitrogen is blown from the pipette onto the soldering locations while the soldering process begins. After the soldering of the leads has taken place, the thermode and the pipette are then brought a into final position.

As used in the present application, the term bending sink refers to a bending die, and particularly to a recessed portion of a bending die. The bending die accepts socalled micropaks, which are circuit chip housings with the external leads extending generally straight therefrom, and bends and cuts the leads to the desired shape for surface mounting of the circuit module.

An apparatus for practicing the method of the invention includes a first linear movement unit having a worm drive shaft and being coupled to a first stepping motor so that the first unit may undergo linear vertical movements. The first linear movement unit is connected to one end of a vertical column and a compression spring is mounted at an opposite end face of the vertical column. The thermode portion of the soldering head is mounted on the opposite end of the column by the compression spring. The stepping motor is operated to vertically move the thermode. The thermode contains individually temperature-controlled soldering stirrups arranged in a rectangle, the soldering stirrups being pressed against leads at solder locations to form solder connections.

A suction pipette is secured to a second linear movement unit, the suction pipette being vertically displaceable and arranged in a position between the soldering stirrups of the thermode. The second linear unit is vertically displaceable by a second stepping motor and a vertical worm gear. Finally, a horizontally extensible optical system is arranged laterally of the thermode for optical inspection of the positions of the circuit module leads.

The thermode approaches the bending sink where the leads of the electrical component have been cut and bent and where the component still sits. The shaped outer leads of the component are stabilized by webs on the soldering head located in the region of the soldering stirrups as the soldering head is lowered onto the component in the bending sink. The thermode retrieves the component from the bending sink by the suction applied to the suction pipette which forms part of the solder head.

The solder head and/or a circuit board holding means is moved to position the component over a corresponding mounting location on the circuit board. The surface-mountable component is adjusted to correctly align the position of the outer leads with solder pads on the appertaining printed circuit board. This alignment is accomplished with the assistance of the optical monitoring system that is introduced at four corners of the outer lead area. Every component alignment motion of the suction pipette is also simultaneously executed by the thermode since the pipette and thermode together make up the soldering head. Alignment of the thermode with the component is, thus, assured. The displaceable optical system is simultaneously used as a component part for automation with image processing.

Due to the individual control of the individual soldering stirrups of the thermode, a temperature which is uniform all around during the soldering process is applied to achieve a high quality soldered connection of the leads to the solder pads. To further improve the quality of the solder connection, nitrogen is blown out through the bores of the suction pipette during the soldering process.

BRIEF DESCRIPTION OF THE DRAWINGS

The present invention shall be set forth in greater detail with reference to illustrations in FIGS. 1 through 3.

DETAILED DESCRIPTION OF THE PREFERRED EMBODIMENTS

Figure 1A:
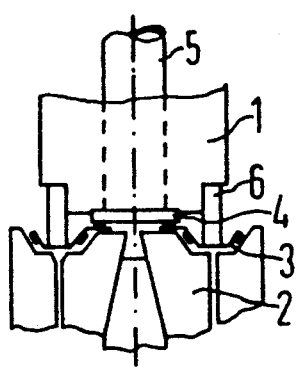
FIG. 1a is a schematic illustration of a surface-mountable component in a bending sink being picked up by a soldering head according to a first method step of the present invention.

FIG. 1a illustrates a first step of the method of the present invention. A thermode 1 of the present soldering system has four separate, individually controllable soldering stirrups 6, and is moveable in a vertical direction. A surface-mountable electrical component 4 which includes outer leads which have been cut and bent in a bending sink 2 is approached by the thermode 1. The position of the bending sink 2 relative to the thermode 1 is known, or may be easily determined. Since the leads of the component 4 have been bent in the bending sink 2, such as in an immediately preceding step, the position of the leads relative to the bending sink 2 is known. The thermode 1 is, thus, correctly positioned above the component 4 relative to the outer electrical leads thereof.

A suction pipette 5 is provided in the soldering head relatively movable to the thermode 1. The suction pipette 5 is lowered onto the upper surface of the component 4 and a vacuum is applied to the pipette 5 so that the component 4 is drawn against the pipette and may thereby be removed from the bending sink 2. The suction pipette 5 and thermode 1 form a unit which is moved together to carry the component from the bending sink 2 to a circuit board. The soldering connections of the surface-mountable component 4 are, thus, aligned and remain so relative to the soldering stirrups 6.

An optical system 12 (shown in FIGS. 1b-1d) may be used to check the position of the outer leads relative to the soldering head. The accuracy of the alignment of the component, and in particular the leads thereof, relative to the soldering stirrups is therefore assured.

Figure 1C:
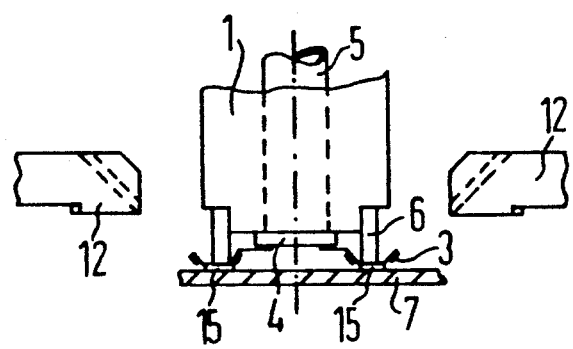
FIG. 1c is a schematic illustration of a soldering step being performed by the soldering head of the present invention.
Figure 1B:
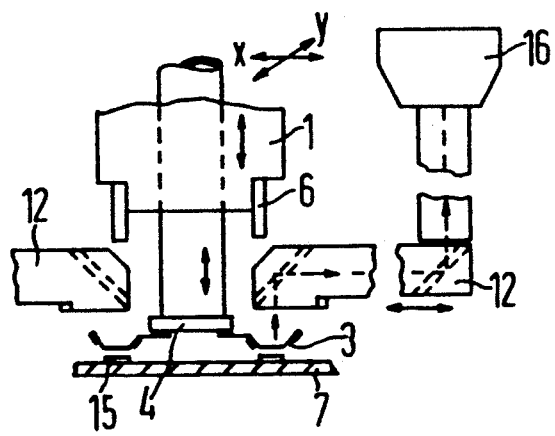
FIG. 1b is a schematic illustration of the component being held on the soldering head of the present invention and being positioned above a mounting location on a circuit board according to a second method step.

In FIG. 1b the component 4 is positioned above a mounting location, such as on a printed circuit board 7. The pipette 5 lowers the module 4 to a position approximately 100 micrometers ($\mu$m) above the printed circuit board 7. By movement of the suction pipette 5, the position of the component 4 is adjusted relative to soldering pads 15 on the circuit board 7 as verified by the optical system 12 which is introducible at, for example, the four corners of the outer lead area. Approximately 18 outer leads at every corner of the component 4 are checked by the preferred optical system. The alignment motion of the component 4 with the pipette 5 also moves the thermode 1 due to the unitary design of the soldering head. Rotational movements may be necessary and are implemented by rotation of a supporting table (not shown) on which the printed circuit board 7 is positioned. Deviations in the position of the leads from the corresponding solder pads in the X-Y plane are, thus, automatically corrected by movement of the solder head of the present soldering system.

When the leads which are observed via a monitor 16 of the optical system 12 are congruent over the solder pads 15, the component 4 is lowered onto the printed circuit board 7 by lowering the pipette 5 into the position shown in FIG. 1c. An optical check of the position of the surface-mountable component 4 on the desired circuit board location is carried out and, where necessary, a further positional correction by movement of the solder head is carried out. When the placement has been verified, the optical system 12 moves to an initial or standby position away from the soldering head and the thermode 1 is lowered onto to the outer leads of the component 4 lying on the pads 15. A current is then applied to the soldering stirrups 6 to cause a soldering of the leads onto the soldering pads 15.

The vacuum that has been applied to the top surface of the component 4 through the pipette 5 is discontinued during the soldering step. Preferably, the pipette 5 moves approximately 5 millimeters in an upward direction above the component and nitrogen is blown through the pipette 5 onto the soldering locations through the suction opening so as to achieve a better meniscus formation of the solder. The nitrogen also serves to cool the inner lead regions of the component.

Figure 1D:
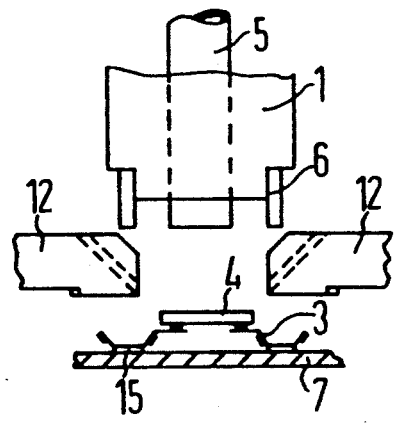
FIG. 1d is a illustration of an optical check of the correctness of the position of the surface-mountable component on the printed circuit board as a final method step.

A further optical check of the correctness of the placement of the component 4 on the circuit board 7 using the optical 12 positioned as shown in FIG. 1d ends the procedure.

Figure 2:
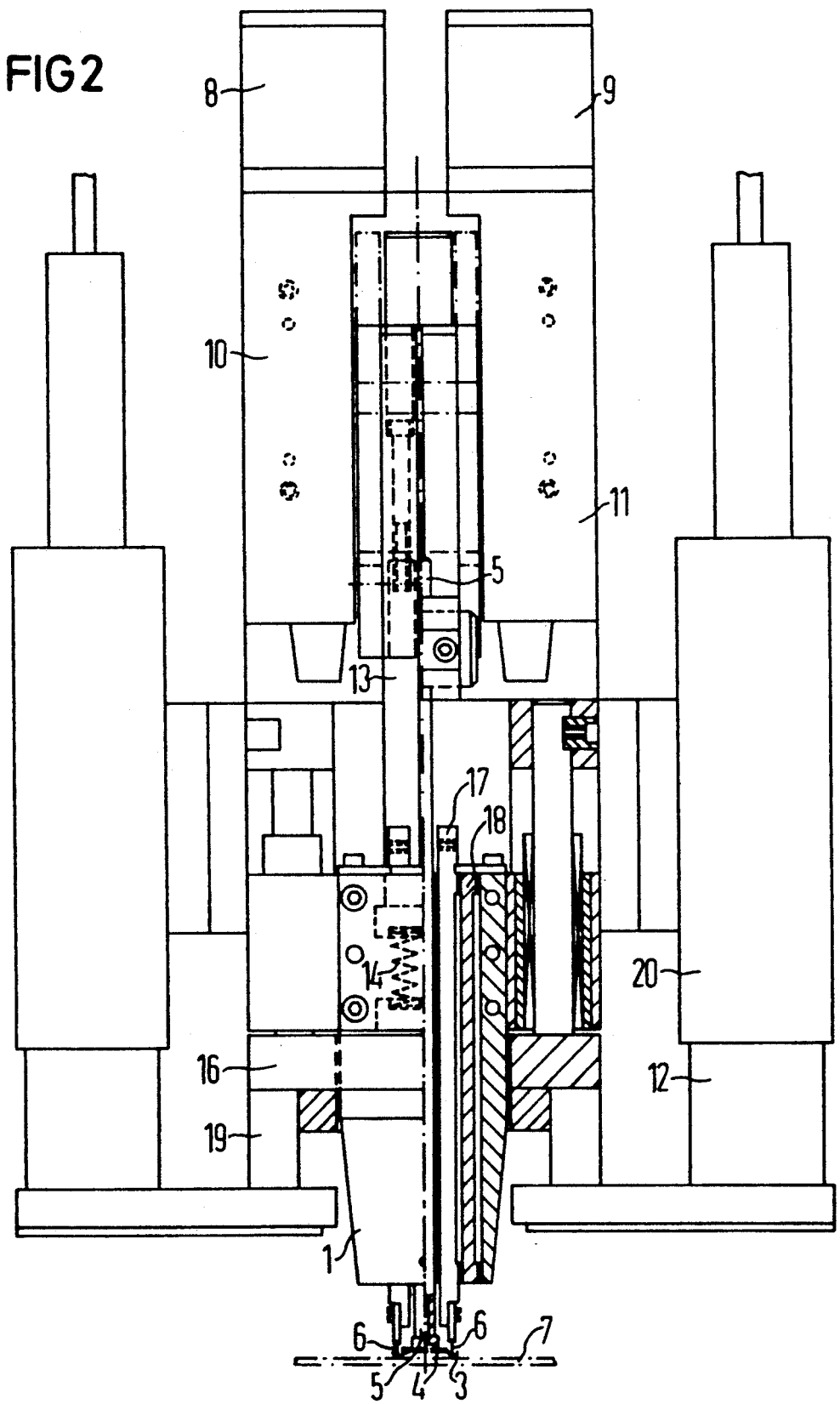
FIG. 2 is a front, elevational view of a soldering head with a thermode portion and a pipette portion according to the principles of the present invention.
Figure 3:
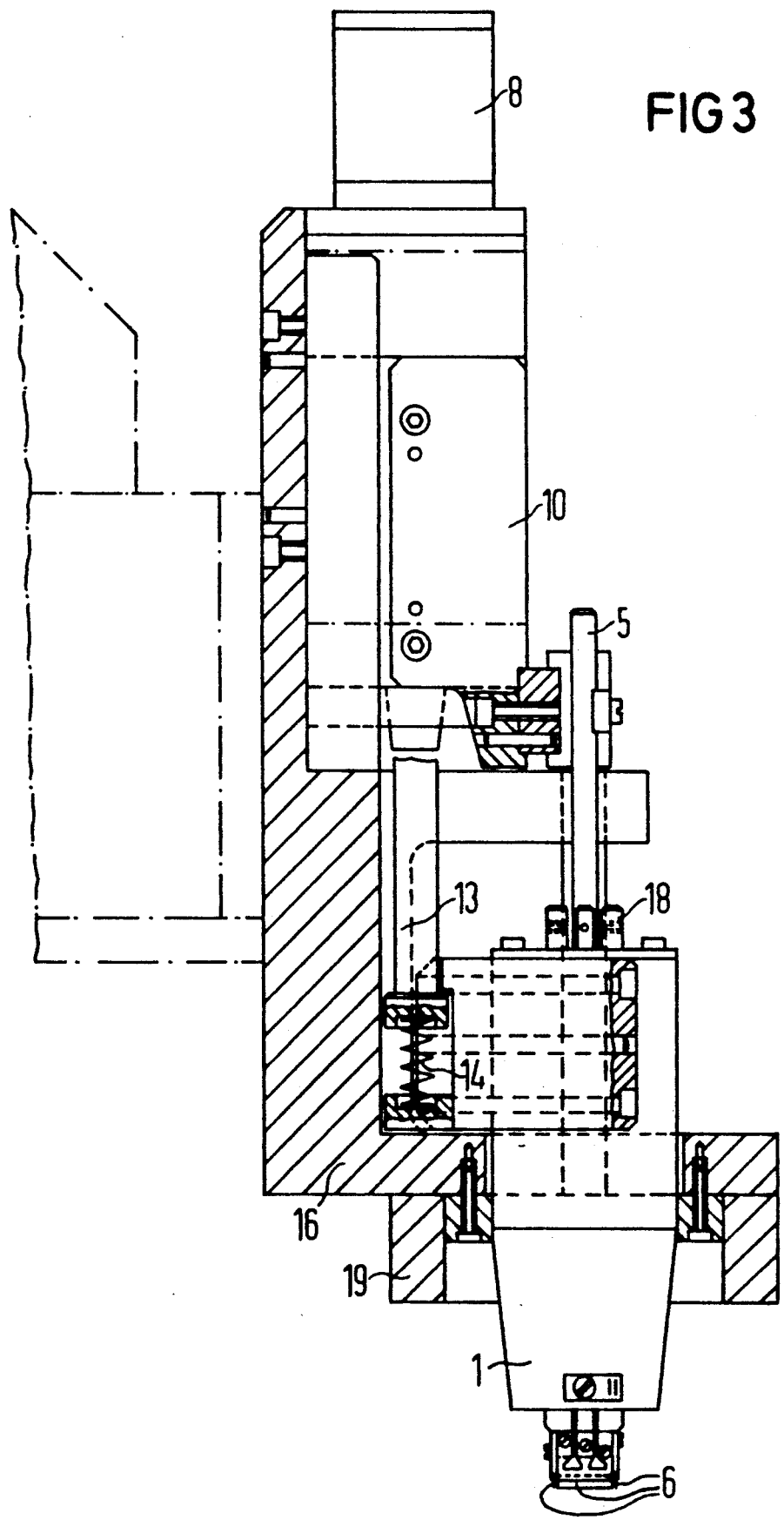
FIG. 3 is a side, elevational view of the soldering head of FIG. 2.

A front view of the soldering head including the thermode 1 and suction pipette 5 is shown in FIG. 2. The soldering head includes a first linear unit 10 and a second linear unit 11, each of which has its own internal worm drive. The first liner unit 10 is driven by a first stepping motor 8 so that rotational motion of stepping motor 8 is converted into vertical motion of the linear unit 10 via the worm drive shaft. Likewise, the second linear unit 11 is driven by a second stepping motor 9 so that rotational motion of the stepping motor 9 is converted into vertical motion of the second linear unit 11 via the worm drive shaft. The two linear units 10 and 11 may be moved independently of one another.

The thermode 1 is resiliently secured to the first linear unit 10 via a column 13 having a compression spring 14 at its end face. The transmission of pressing forces of the first linear unit 10 ensues through the column 13 and the compression spring 14 to the thermode 1 to press the soldering stirrups 6 onto the leads of the component 4. The soldering forces, or pressing forces, are dependent upon the spring constant, on the weight of the thermode, and the displacement path of the first stepping motor 8.

The suction pipette 5 is attached to the second linear unit 11 and is moved independently of the thermode 1 in a vertical direction. The pipette 5 is arranged so that it is situated in the center of the rectangularly arranged four soldering stirrups 6 of the thermode 1. The pipette 5 is thus vertically moveable toward and away from the component being soldered by the thermode 1.

The two linear units 10 and 11 are structurally rigidly connection in the horizontal directions by a fastening part 16 so that every alignment motion of the component 4 via the pipette 5 also results in movement of the thermode 1.

The feed of voltage, or current, to the soldering stirrups 6 ensues through the soldering stirrup holders 17 and an outside thermode member 18. The control of the electrical power to the soldering stirrups is known.

The optical system 12 also includes an annular lamp 19 which is arranged around above the thermode 1. The lamp 19 illuminates the component leads and the solder pads to assure accurate alignment without shadows. The optical system 12 may be moved via a pneumatic cylinder 20 in a lateral direction. The optical system may, thus, be moved out of the way during, for example, the actual soldering. Further, a TV probe in the inside of the cylinder 20 leads from the optical system to monitors (shown in FIG. 1b), at which the precision of the position may be observed. The pipette 5 is thereby shown in the suctioning position.

Thus, there is shown and described a method and apparatus for accurately soldering surface-mountable components to printed circuit boards. A suction pipette is positioned over the component while the component is in a lead bending die and the component is picked up and moved into position over the printed circuit board solder locations, as verified by an optical system. A soldering thermode which is vertically moveable relative to the pipette yet horizontally fixed relative thereto and which forms a part of the soldering head is lowered into position to solder the outer leads of the component once the pipette positions the component correctly. The suction pipette may be used to direct nitrogen onto the soldering locations for improved meniscus formation and cooling. The invention is particularly applicable to multiple components having outer lead spacings of less than 150 micrometers.

Although other modifications and changes may be suggested by those skilled in the art, it is the intention of the inventors to embody within the patent warranted hereon all changes and modifications as reasonably and properly come within the scope of their contribution to the art.

WE CLAIM:

1. A method for a soldering surface-mountable component having outer leads onto solder locations of a printed circuit board, comprising the steps of:
   lowering a combination thermode and suction pipette to a known position over the component as the component is on a bending sink;
   applying a suction to the suction pipette to temporarily affix the component to the suction pipette;
   optically checking a position of the outer leads of the component relative to the thermode and suction pipette;
   positioning the component while affixed on the suction pipette at a mounting location the printed circuit board;
   optically checking a position of the outer leads of the component relative to the solder locations on the printed circuit board;
   lowering the thermode until the outer leads of the component are positioned on the soldering locations of the printed circuit board;
   discontinuing the suction to the suction pipette;
   displacing the suction pipette a short distance above the component surface;
   blowing nitrogen through the suction pipette onto the soldering locations and simultaneously applying soldering current to the thermode;
   returning the thermode and suction pipette to a final position.

2. An apparatus for soldering surface-mountable components onto a printed circuit board, comprising:
   a first linear unit having a first worm drive shaft for movement in a vertical direction;
   a first stepping motor coupled to said first worm drive shaft;
   a column having a first end connected to said first linear unit and a compression spring at an opposite end;
   a thermode mounted at said opposite end of said column via said compression spring;
   soldering stirrups arranged in a rectangle on said thermode, said soldering stirrups being individually temperature controlled;
   a second linear unit having a second worm drive shaft for vertical movement;
   a second stepping motor coupled to said second worm drive shaft for vertically moving said second linear unit;
   a suction pipette affixed to said second linear unit and means for applying a suction to said suction pipette, said suction pipette being arranged within said soldering stirrups of said thermode, and
   a horizontally moveable optical system arranged laterally of said thermode.

* * * * *